United States Patent [19]

Duyal

[11] Patent Number: 4,786,582
[45] Date of Patent: Nov. 22, 1988

[54] ORGANIC SOLVENT FREE DEVELOPER FOR PHOTOSENSITIVE COATINGS

[75] Inventor: Tulay Duyal, Manalapan, N.J.

[73] Assignee: Hoechst Celanese Corporation, Somerville, N.J.

[21] Appl. No.: 917,576

[22] Filed: Oct. 10, 1986

Related U.S. Application Data

[63] Continuation-in-part of Ser. No. 762,079, Aug. 2, 1985, abandoned.

[51] Int. Cl.$^4$ .................................................. G03C 5/18
[52] U.S. Cl. ...................................... 430/331; 430/309
[58] Field of Search ................................. 430/331, 309

[56] References Cited

U.S. PATENT DOCUMENTS

| | | | |
|---|---|---|---|
| 3,457,171 | 10/1969 | Alles | 430/331 |
| 3,891,439 | 6/1975 | Katz et al. | 430/331 |
| 4,093,465 | 6/1978 | Chu et al. | 430/175 |
| 4,308,340 | 12/1981 | Walls | 430/331 |
| 4,350,756 | 9/1982 | Burch et al. | 430/331 |
| 4,366,224 | 12/1982 | Hsieh . | |
| 4,395,480 | 7/1983 | Sprintschnik | 430/309 |
| 4,436,807 | 3/1984 | Walls . | |
| 4,511,640 | 4/1985 | Liu . | |
| 4,618,562 | 10/1986 | Walls et al. . | |
| 4,659,645 | 4/1987 | Frommeld et al. | 430/175 |
| 4,692,397 | 9/1987 | Liu | 430/331 |

Primary Examiner—Paul R. Michl
Assistant Examiner—Patrick A. Doody
Attorney, Agent, or Firm—Richard S. Roberts

[57] ABSTRACT

An organic solvent free developing composition which comprises an aqueous admixture having a pH of from about 6.8 to about 7.2 of (a) one or more components selected from the group consisting of tri-sodium, -lithium, or -potassium phosphate, or sodium, lithium or potassium carbonate; and (b) one or more components selected from the group consisting of sodium, lithium, or potassium benzoate or salicylate; and (c) one or more components selected from the group consisting of sodium, lithium, potassium, magnesium or calcium octyl, decyl or dodecyl sulfate; and (d) one or more components selected from the group consisting of mono-sodium, -lithium, or -potassium phosphates and carbonates, and (e) sufficient water to formulate an effective developer.

15 Claims, No Drawings

ORGANIC SOLVENT FREE DEVELOPER FOR PHOTOSENSITIVE COATINGS

BACKGROUND OF THE INVENTION

The present invention relates to a composition for developing photosensitive coatings. More specifically, the present invention relates to a method of developing photosensitive lithographic printing plates and similar photographic elements. More particularly, the invention relates to aqueous alkaline developers suitable for removing the non-image areas of negative working photographic elements, which developers are free of organic solvents.

The art of lithographic printing depends upon the immiscibility of grease and water, upon the preferential retention of a greasy image-forming substance by an image area, and upon the similar retention of an aqueous dampening fluid by a non-image area. When a greasy image is imprinted upon a suitable surface and the entire surface is then moistened with an aqueous solution, the image area will repel the water and the non-image area will retain the water. Upon subsequent application of greasy ink, the image portion retains ink whereas the moistened non-image area repels it. The ink on the image area is then transferred to the surface of a material on which the image is to be reproduced, such as paper, cloth and the like, via an intermediary, a so-called offset or blanket cylinder, which is necessary to prevent mirror-image printing.

The most common type of lithographic plate to which the present invention is directed has a coating of a light-sensitive substance that is adherent to an aluminum base sheet. Depending upon the nature of the photosensitive coating employed, the treated plate may be utilized to reproduce directly the image to which it is exposed, in which case it is termed a positive acting plate, or to produce an image complementary to the one to which it is exposed, in which case it is termed a negative acting plate. In either case the image area of the developed plate is oleophilic and the non-image is hydrophilic.

Exposure is effected through a negative transparency, where the light sensitive material, commonly a diazo compound, is caused to harden and thereby become insoluble in a desensitizing solution applied to the plates after light exposure for the purpose of removing that part of the light sensitive coating which, because it was protected from the light by the negative, was not light hardened. The light hardened surface of a negative plate will be the oleophilic surface compatible with the greasy ink and is called the "image-area". The surface from which the non-hardened light sensitive material has been removed by a desensitizer will be, or can be, converted to a hydrophilic surface having little affinity for the greasy ink and is called the "non-image" area.

The present invention provides a new developer for negative working lithograpic printing plates.

Most developing compositions for negative working printing plates disadvantageously contain strong organic solvents. These are both expensive and ecologically not favored. In recent years certain aqueous alkaline developing compositions have been developed and employed for such purposes. While they are less costly and dangerous to the environment, they do pose several technical problems. Specifically, they tend to corrode aluminum, foam and precipitate when used in developing machinery and additionally have a relatively slow development speed. The present invention provides a developing composition which substantially alleviates these problems.

SUMMARY OF THE INVENTION

The invention provides an organic solvent free developing composition which comprises an aqueous admixture having a pH of from about 6.8 to about 7.2 of
  (a) one or more components selected from the group consisting of tri-sodium, -lithium, or -potassium phosphate, or sodium, lithium or potassium carbonate; and
  (b) one or more components selected from the group consisting of sodium, lithium, or potassium benzoate or salicylate; and
  (c) one or more components selected from the group consisting of sodium, lithium, potassium, magnesium or calcium octyl, decyl or dodecyl sulfate; and
  (d) one or more components selected from the group consisting of mono-sodium, -lithium, or -potassium phosphates and carbonates, and
  (e) sufficient water to formulate an effective developer.

It is, therefore, an object of the present invention to provide a lithographic printing plate developer which is a solution having a neutral pH.

It is a further object of the present invention to provide a negative working lithographic printing plate which alleviates the hereinbefore mentioned problems.

These and other objects of the instant invention will be in part discussed and in part apparent upon consideration of the detailed description of the preferred embodiment.

DETAILED DESCRIPTION OF THE PREFERRED EMBODIMENT

In the production of a photographic element, a sheet substrate, preferably aluminum and the alloys thereof especially those aluminum compositions suitable for the manufacture of lithographic printing plates such as Alcoa 3003 and Alcoa 1100 which may or may not have been pretreated by standard graining and/or etching and/or anodizing techniques as are well known in the art, may be coated by spraying, brushing, dipping or other means with a composition suitable for use as an interlayer for lithographic plates. Standard metal substrate pretreatments include electrolytically anodizing in sulfuric and/or phosphoric acids, electrolytically etching in hydrochloric acid, and chemical or mechanical graining by well known methods, which are all known to the skilled worker. Interlayer compositions employable in the practice of this invention include aqueous solutions of alkali silicate and polyvinyl phosphonic acid.

Said substrate is then coated by means well known in the art with a photosensitive coating which comprises a negative working diazo photosensitizer and may contain suitable colorants, resins, acid stabilizers and other art recognized ingredients. After drying, the coated substrate is exposed to ultraviolet radiation through a photographic mask in a known manner.

The exposed photographic element is then developed to remove the non-image areas by cleaning with the developer solution provided in this invention.

The developer employed is an aqueous based solution which has a pH in the range of from about 6.8 to about 7.2, more preferably from about 6.9 to about 7.1 and most preferably from about 7.0.

The composition contains a component (a) which is one or more components selected from the group consisting of tri-sodium, -lithium, or -potassium phosphate, or sodium, lithium or potassium carbonate. The most preferred ingredient is trisodium phosphate. This component may be present in the developer composition in an amount of from about 10.0% to about 0.5%, preferably from about 8.0% to about 1.0%, and most preferably from about 5.0% to about 2.0%, based on the weight of the developer composition.

The composition contains a component (b) which is one or more components selected from the group consisting of sodium, lithium, or potassium benzoate or salicylate. The most preferred ingredient is sodium benzoate. This component may be present in the developer composition in an amount of from about 20.0% to about 0.5%, preferably from about 15.0% to about 1.5%, and most preferably from about 7.0% to about 2.0%, based on the weight of the developer composition.

The composition contains a component (c) which is one or more components selected from the group consisting of sodium, lithium, potassium, magnesium or calcium octyl, decyl or dodecyl sulfate. The most preferred ingredient is sodium octyl sulfate. This component may be present in the developer composition in an amount of from about 10.0% to about 1.0%, preferably from about 8.0% to about 2.0%, and most preferably from about 5.0% to about 2.5%, based on the weight of the developer composition.

The composition contains a component (d) which is one or more components selected from the group consisting of monosodium, -lithium, or -potassium phosphates and carbonates. The most preferred ingredient is mono-sodium phosphate. This component may be present in he developer composition in an amount of from about 5.0% to about 0.2%, preferably from about 4.0% to about 0.5%, and most preferably from about 2.0% to about 0.7%, based on the weight of the developer composition.

The composition further contains sufficient water to formulate an effective developer containing the foregoing components.

In the preferred embodiment, the developer composition further contains a defoam component. Preferred defoaming components include DB-31 and DB-100 silicone emulsion defoamers commercially available from Dow Corning. Another effective defoamer is SE-57 available from Wacker Chemie. This component may be present in the developer composition in an amount of from about 0.2% to about 0.001%, preferably from about 0.07% to about 0.005%, and most preferably from about 0.04% to about 0.01%, based on the weight of the developer composition.

The following examples illustrate the invention.

EXAMPLE 1

A developer is prepared having the following ingredients. All non-water parts are anhydrous.

|  | % (W/W) |
| --- | --- |
| Tap Water | 83.54 |
| Sodium Octyl Sulfate | 3.00 |
| Sodium Benzoate | 10.00 |
| Monosodium Phosphate | 0.86 |

-continued

|  | % (W/W) |
| --- | --- |
| Trisodium Phosphate | 2.60 |

The developer adjusted to have a pH of 7.0 with trisodium phosphate and monosodium phosphate. The solution is then frozen and allowed to return to room temperature. At room temperature, a clear solution is observed.

Slurry grained an anodized lithographic printing plates, commercially available as A-30 and A-60 from American Hoechst Corporation, are exposed (270 mJ/cm$^2$) using a negative test mask. The plates are easily developed. The example is repeated using A-30 and A-60 plates which have been subjected to accelerated shelf like testing by baking in a 100° C. oven for 2 hours. Such aged plates are also satisfactorily developed.

EXAMPLE 2

Example 1 is repeated except the sodium benzoate is reduced to 6.5% and the amount of water is commensurately reduced. Similar results are noted.

A 21-step Stouffer step wedge gives a solid 5 and two ghost steps. Such a result is preferred and expected from a proper developer.

EXAMPLE 3

A developer is prepared having the following ingredients.

| Tap Water | 91.54 |
| --- | --- |
| Sodium-Octyl Sulfate | 2.00 |
| Mono-sodium phosphate | 0.86 |
| Tri-sodium phosphate | 2.60 |
| Sodium benzoate | 3.00 |

The developer is adjusted to have a pH of 7.0 with trisodium phosphate and monosodium phosphate. The solution is frozen and allowed to return to room temperature. At room temperature, a clear solution is observed.

A-30 and A-60 plates are exposed (270 mJ/cm$^2$) using a negative test flat.

The plates are developed and after considerable development time are desensitized. A 21 step Stouffer step wedge, which is part of the test flat is inked and found to give 7 solid and 5 ghost steps after inking, however aged, plates cannot be satisfactorily developed.

EXAMPLE 4

Example 3 is repeated except that the sodium benzoate is increased to 10.0% and the amount of water is commensurately reduced. The developer is observed to have good development speed. Inadequate background desensitizing capability is observed when the test is repeated on aged plates.

What is claimed is:

1. An organic solvent free developing composition which comprises an aqueous admixture having a pH of from about 6.8 to about 7.2 of
   (a) one or more components selected from the group consisting of tri-sodium, -lithium, or -potassium phosphate, or sodium, lithium or potassium carbonate; and (b) one or more components selected from the group consisting of sodium, lithium, or potassium benzoate or salicylate; and (c) one or more components selected from the group consisting of sodium lithium, potassium, magnesium or calcium octyl, decyl or dodecyl sulfate; and (d) one or more components selected from the group consisting of mono-sodium, -lithium, or -potassium phosphates and carbonates, and (e) sufficient water to formulate an effective developer wherein said ingredient (a) is present in an amount of from about 0.5% to about 10% by weight of the overall composition, and wherein said ingredient (b) is present is an amount of from about 0.5% to about 20% by weight of the overall composition, and wherein said ingredient (c) is present in an amount of from about 1% to about 10% by weight of the overall composition, and wherein said ingredient (d) is present in an amount of from about 0.2% to about 5.0% by weight of the overall composition, and wherein said composition is organic solvent free, and wherein at least one of components (a) and (d) is a phosphate.

2. The composition of claim 1 wherein said ingredient (a) is tri-sodium phosphate.

3. The composition of claim 1 wherein said ingredient (b) is sodium benzoate.

4. The composition of claim 1 wherein said ingredient (c) is sodium octyl sulfate.

5. The composition of claim 1 wherein said ingredient (d) is monosodium phosphate.

6. The composition of claim 1 further comprising a defoaming agent.

7. The composition of claim 6 wherein said defoaming agent is a silicone emulsion.

8. The composition of claim 1 wherein said ingredient (a) is present in an amount of from about 1.0% to about 8.0% by weight of the overall composition.

9. The composition of claim 1 wherein said ingredient (b) is present in an amount of from about 1.5% to about 15.0% by weight of the overall composition.

10. The composition of claim 1 wherein said ingredient (c) is present in an amount of from about 2.0% to about 8.0% by weight of the overall composition.

11. The composition of claim 1 wherein said ingredient (d) is present in an amount of from about 0.5% to about 4.0% by weight of the overall composition.

12. The composition of claim 6 wherein said defoaming agent is present in an amount of from about 0.001% to about 0.2% by weight of the overall composition.

13. The composition of claim 1 comprising sodium octyl sulfate, sodium benzoate, mono-sodium phosphate and trisodium phosphate.

14. The composition of claim 13 further comprising a silicone emulsion defoaming agent.

15. The composition of claim 14 comprising from about 2.0% to about 5.0% trisodium phosphate; and from about 2.0% to about 7.0% sodium benozate; and from about 2.5% to about 5.0% sodium octyl sulfate; and from about 0.7% to about 2.0% monosodium phosphate; and from about 0.1% to about 0.4% silicone emulsion defoaming agent, based on the weight of the overall composition; and sufficient water to formulate an effective developer.

* * * * *